US010622460B2

(12) United States Patent
Gauthier et al.

(10) Patent No.: US 10,622,460 B2
(45) Date of Patent: Apr. 14, 2020

(54) VERTICAL QUANTUM TRANSISTOR

(71) Applicant: STMicroelectronics (Crolles 2) SAS, Crolles (FR)

(72) Inventors: Alexis Gauthier, Meylan (FR); Guillaume C. Ribes, Bernin (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/407,383

(22) Filed: May 9, 2019

(65) Prior Publication Data

US 2019/0267473 A1 Aug. 29, 2019

Related U.S. Application Data

(62) Division of application No. 15/707,258, filed on Sep. 18, 2017, now Pat. No. 10,332,982.

(30) Foreign Application Priority Data

Mar. 22, 2017 (FR) ...................... 17 52371

(51) Int. Cl.
*H01L 29/739* (2006.01)
*H01L 29/66* (2006.01)
*H01L 21/02* (2006.01)
*H01L 29/12* (2006.01)
*H01L 49/00* (2006.01)
*H01L 29/78* (2006.01)
(Continued)

(52) U.S. Cl.
CPC .. *H01L 29/66666* (2013.01); *H01L 21/02532* (2013.01); *H01L 21/02595* (2013.01); *H01L 21/28008* (2013.01); *H01L 29/127* (2013.01); *H01L 29/42376* (2013.01); *H01L 29/7827* (2013.01); *H01L 49/006* (2013.01); *H01L 21/308* (2013.01)

(58) Field of Classification Search
CPC ......... H01L 29/66666; H01L 29/42376; H01L 21/28008; H01L 29/7827; H01L 49/006; H01L 29/127; H01L 21/02532; H01L 21/02595; H01L 21/308; H01L 29/42372; H01L 29/7395; H01L 29/732; H01L 29/7371; H01L 29/7788; H01L 29/78642
See application file for complete search history.

(56) References Cited

U.S. PATENT DOCUMENTS 4,530,149 A * 7/1985 Jastrzebski ............ H01L 21/28
257/E21.131
5,252,849 A * 10/1993 Fitch .................... H01L 21/8221
257/329

(Continued)

FOREIGN PATENT DOCUMENTS

DE 19711481 A1 10/1998

OTHER PUBLICATIONS

INPI Search Report and Written Opinion for FR 1752371 dated Nov. 17, 2017 (8 pages).

*Primary Examiner* — Bitew A Dinke
(74) *Attorney, Agent, or Firm* — Crowe & Dunlevy

(57) ABSTRACT

A vertical transistor includes two portions of a gate conductor that extend within a layer of insulator. An opening extending through the later of insulator includes source, channel and drain regions form by epitaxy operations. A thickness of the portions of the gate conductor decreases in the vicinity of the channel region.

20 Claims, 3 Drawing Sheets

(51) Int. Cl.
*H01L 21/28* (2006.01)
*H01L 29/423* (2006.01)
*H01L 21/308* (2006.01)

(56) References Cited

U.S. PATENT DOCUMENTS

| | | | |
|---|---|---|---|
| 5,308,778 A * | 5/1994 | Fitch | H01L 21/8221 438/128 |
| 5,414,289 A * | 5/1995 | Fitch | H01L 21/823487 257/296 |
| 5,994,735 A | 11/1999 | Maeda et al. | |
| 6,033,980 A * | 3/2000 | Liou | H01L 21/76807 257/E21.579 |
| 6,489,234 B1 * | 12/2002 | Itoh | H01L 21/31144 257/E21.257 |
| 9,087,730 B2 | 7/2015 | Forbes | |
| 10,014,372 B1 * | 7/2018 | Leobandung | H01L 29/1037 |
| 2002/0028541 A1 | 3/2002 | Lee et al. | |
| 2002/0195652 A1 * | 12/2002 | Maeda | H01L 27/092 257/328 |
| 2005/0074962 A1 * | 4/2005 | Lojek | H01L 21/28123 438/622 |
| 2010/0019304 A1 | 1/2010 | Minami et al. | |
| 2010/0207200 A1 | 8/2010 | Masuoka et al. | |
| 2010/0295009 A1 | 11/2010 | Lung et al. | |
| 2015/0370947 A1 | 12/2015 | Moroz et al. | |
| 2016/0064541 A1 | 3/2016 | Diaz et al. | |
| 2016/0079391 A1 * | 3/2016 | Boivin | H01L 29/66825 438/269 |
| 2016/0133633 A1 | 5/2016 | Liaw | |
| 2017/0133513 A1 * | 5/2017 | Hong | H01L 29/78642 |
| 2018/0083136 A1 * | 3/2018 | Xie | H01L 29/7827 |
| 2018/0248034 A1 * | 8/2018 | Leobandung | H01L 21/823481 |

* cited by examiner the appended figures, in which:
VERTICAL QUANTUM TRANSISTOR

CROSS REFERENCE TO RELATED APPLICATIONS

This application is a divisional of U.S. patent application Ser. No. 15/707,258 filed Sep. 18, 2017, which claims the priority benefit of French Application for Patent No. 1752371, filed on Mar. 22, 2017, the disclosures of which are hereby incorporated by reference in their entireties to the maximum extent allowable by law.

TECHNICAL FIELD

The present application relates to integrated circuit components and methods for the fabrication thereof, and more particularly to transistors.

BACKGROUND

One objective of research in the electronics industry is to decrease the size of integrated circuit components, in particular the size of transistors. It is nowadays possible to fabricate transistors that are equal to a few atoms in size. Quantum transistors are then spoken of. This decrease in size causes numerous problems. In particular, the impact of fabrication errors, for example sizing errors or imprecision, is much more substantial when fabricating quantum transistors, the margin of variation being significantly smaller.

There is therefore a need for a fabrication method allowing the elements of a reliable quantum transistor to be formed with a high level of precision.

SUMMARY

Thus, one embodiment envisages a vertical transistor comprising two portions of a gate conductor extending into a layer of insulator between a drain and a source, on either side of a channel region formed by epitaxy, the thickness of the gate conductor portions decreasing in the vicinity of the channel region.

According to one embodiment, the thickness of each gate conductor portion is substantially between 3.5 and 7 nm and decreases to a value that is substantially between 0.5 and 2 nm in the vicinity of the channel region.

According to one embodiment, the length of the channel is between 1 and 5 nm.

According to one embodiment, the width of the channel is between 7 and 13 nm.

One embodiment envisages a method for fabricating a vertical transistor, comprising: implanting a source or a drain into a substrate; depositing a first layer of insulator; depositing a gate conductor; depositing a second layer of insulator; depositing a third layer of insulator; etching a first cavity into the third and second layers of insulator until reaching the gate conductor; depositing a fourth layer of insulator; forming spacers on the flanks of the cavity; etching the parts of the second and fourth layers of insulator that are not covered by the spacers and the third layer of insulator; oxidizing the gate conductor between the spacers; etching a second cavity between the spacers until reaching the substrate; forming the channel in the second cavity by epitaxy; and forming the drain or the source on the structure.

According to one embodiment, the first, second and fourth layers of insulator are made of silicon oxide.

According to one embodiment, the gate conductor is made of doped polycrystalline silicon.

According to one embodiment, the third layer of insulator and the spacers are made of silicon nitride.

According to one embodiment, the formation of the channel comprises: forming a first n-doped layer by epitaxy; forming a first p-doped layer by epitaxy; forming an undoped layer by epitaxy; forming a second p-doped layer by epitaxy; forming a second n-doped layer by epitaxy; and carrying out an annealing operation.

According to one embodiment, the n-doped layers are layers of silicon doped with arsenic atoms.

According to one embodiment, the p-doped layers are layers of silicon doped with boron atoms and containing carbon.

According to one embodiment, the undoped layer is a layer of silicon enriched with carbon atoms.

BRIEF DESCRIPTION OF THE DRAWINGS

These features and advantages, and others, will be described in detail in the following non-limiting description of particular embodiments, which is given with reference to the appended figures, in which.

DETAILED DESCRIPTION

The various figures have not been drawn to scale and, in addition, in the various figures, elements that are the same have been referenced by the same references. For the sake of clarity, only those elements which are useful to the comprehension of the described embodiments have been shown and are described in detail. In particular, the gate, drain and source contacts are neither shown nor described.

In the following description, when reference is made to terms such as "above", "horizontal", "vertical", etc., reference is being made to the orientation of the elements in question in the figures. Unless specified otherwise, the expressions "approximately", "substantially", "around" and "of" the order of signify to within 10%, preferably to within 5%.

Figure 1:
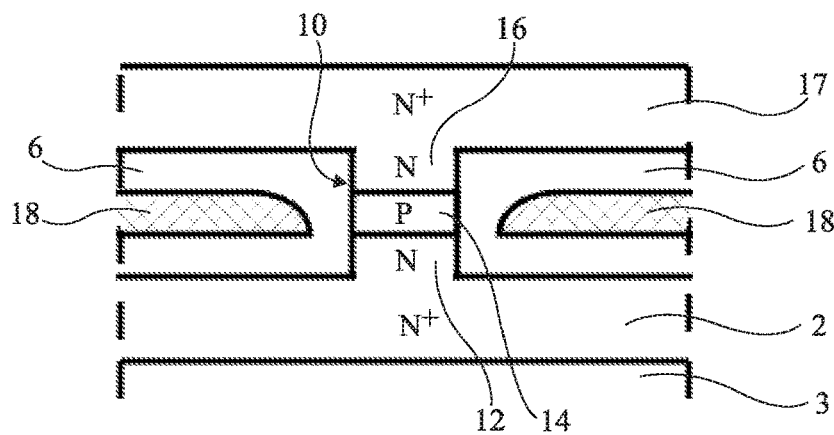
FIG. 1 is a cross-sectional view of one embodiment of a vertical transistor.

FIG. 1 is a cross-sectional view of one embodiment of a nanometer-scale vertical MOS transistor, placing it in the category of quantum transistors. Such a transistor is referred to by the acronym QVMOS, which stands for quantum vertical MOS.

The term "vertical transistor" here refers to a transistor the source and drain zones of which are formed from layers extending over one another, in parallel to a main face of a semiconductor substrate.

The QVMOS transistor comprises a source zone 2 consisting of a heavily n-doped region formed on or in a semiconductor substrate 3, for example a monolithic silicon substrate or an SOI (silicon on insulator) substrate. The source zone 2 is covered by a layer 6 of insulator, for example of silicon oxide. An opening 10 passes through the layer 6 of insulator. The opening 10 is filled with semiconductor material, for example with silicon, and comprises three regions: an n-doped region 12, a lightly p- or n-doped region 14 and an n-doped region 16. The regions 12 and 16 correspond to the regions referred to as LDD (low drain diffusion) regions in a conventional MOS transistor. The p-doped region 14 forms the actual channel of the QVMOS transistor shown.

The regions 12, 14 and 16 are the result of successive epitaxy operations, allowing the level of doping of the region 14 to be well controlled and sharp junctions between this region 14 and the regions 12 and 16 to be formed. The region 14 is almost intrinsic, that is to say actually lightly p- or n-doped with a level of doping of less than $10^{16}$ atoms/cm$^3$. The regions 12 and 16 are, for example, doped with arsenic atoms at a concentration varying, for example, between $10^{17}$ and $10^{20}$ atoms/cm$^3$.

A drain zone 17 made of an n-doped semiconductor material, for example silicon, covers the structure and makes contact with the n-doped region 16. This drain zone 17 is the result of an epitaxy operation and is monocrystalline at the level of its contact with the region 16 and polycrystalline elsewhere. The drain 17 and source 2 zones are, for example, doped with arsenic, for example at a concentration of more than $10^{19}$ atoms/cm$^3$, for example.

Two portions 18 of an n-doped polycrystalline silicon layer, with a level of doping of more than $5\times10^{19}$ atoms/cm$^3$, extend into the insulator 6 on each side of the channel. The QVMOS transistor shown here is what is referred to as a "gate-all-around" transistor, meaning that its channel is at least partially surrounded by gates. Each portion 18 forms a gate conductor. Each gate conductor portion 18 is separated from the channel 14 by part of the layer 6 forming a gate insulator. Each gate portion 18 is insulated from the source 2 and drain 17 zones by parts of the layer 6 of insulator. The gate portions 18 extend sufficiently far that contacts are made at the level of each gate, these contacts normally being interconnected.

The thickness of the gate portions 18 is, for example, less than 7 nm, for example between 3.5 and 7 nm, this thickness decreasing, for example, to a value that is between 0.5 and 2 nm in the vicinity of the channel. The distance between the end of each gate conductor portion 18 and the channel, which corresponds to the thickness of the gate insulator, is, for example, between 1 and 3 nm, for example 2.5 nm. The thickness of the parts of the insulator 6 separating the gate portions 18 from the source and drain zones is for example between 7 and 15 nm, for example 10 nm.

The width of the opening 10 passing through the layer 6, also referred to as the channel width, may be between 7 and 13 nm, for example 10 nm. The length of the channel, which corresponds to the thickness of the region 14, is between 1 and 5 nm, for example around 3 nm.

Such a transistor has several advantages. One advantage of this transistor is that the slimmer profile of the gate conductor portions 18 in the vicinity of the channel allows excellent control of this channel and of the number of charges passing therethrough when the gate is being controlled.

One advantage of the formation of the channel by means of successive epitaxy operations is that this allows excellent control of the size and of the doping of the channel.

FIGS. 2A to 2G are cross-sectional views illustrating steps of one embodiment of a method for fabricating a QVMOS transistor such as that illustrated in FIG. 1.

Figure 2A:
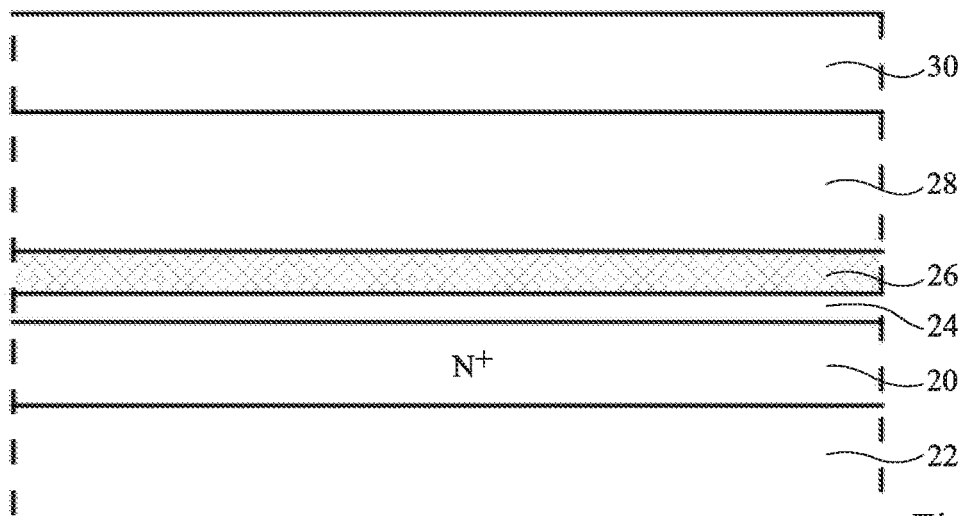
FIGS. 2A to 2G are cross-sectional views showing steps of one embodiment of a method for fabricating a vertical transistor.

FIG. 2A shows the outcome of the initial fabrication steps. During these initial steps, a region 20 of a semiconductor substrate 22, for example made of silicon, is heavily doped (with more than $10^{20}$ atoms/cm$^3$) so as to form a source zone. The region 20 is covered with the following successive layers:

a layer 24 of insulator, for example of silicon oxide, the thickness of which is for example between 7 and 15 nm, for example 10 nm;

a conductive layer 26, made of doped polycrystalline silicon, the thickness of which is for example less than 7 nm, for example between 3.5 and 7 nm;

a layer 28 of insulator, for example of silicon oxide; and a layer 30 of insulator, for example of silicon nitride, the insulator 30 being selectively etchable with respect to the insulator 28.

Figure 2B:
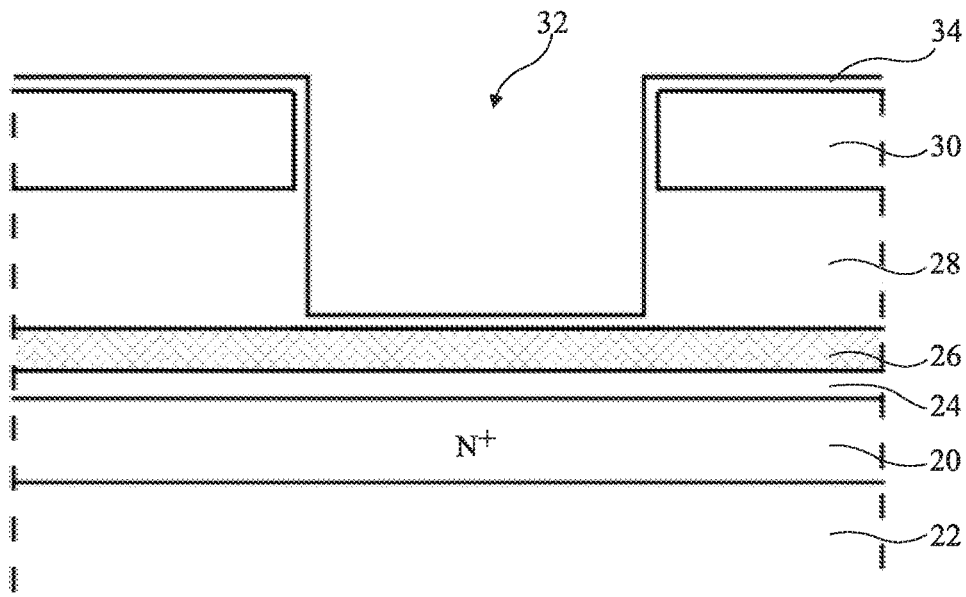

In the step the outcome of which is illustrated in FIG. 2B, a cavity 32 has been hollowed out of the layers 30 and 28 of insulator, so as to reach the conductive layer 26. The overall structure is next conformally covered with a layer 34 of insulator. The insulator 34 is for example silicon oxide.

Figure 2C:
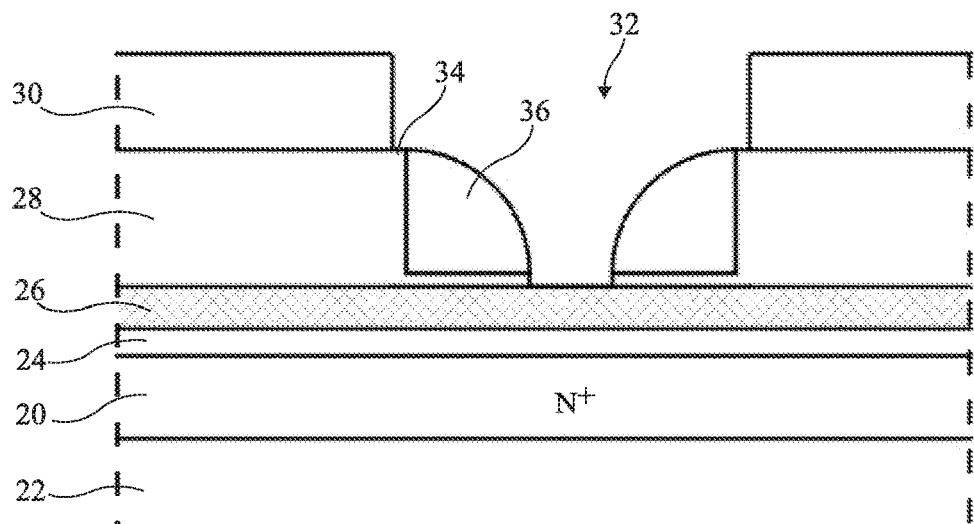

In the step the outcome of which is illustrated in FIG. 2C, an intermediate layer of insulator, for example of silicon nitride, is formed on the structure. Spacers 36, the height of which is approximately equal to the thickness of the silicon oxide layer 28, are formed on the flanks of the cavity 32 by anisotropically etching the intermediate layer of insulator. The layer 34 of silicon oxide is next removed, apart from the portions of this layer 34 that are covered by the spacers 36. Thus, a portion of the polycrystalline silicon layer 26 located between the two spacers 36 is exposed.

The thickness of the intermediate layer of silicon nitride, the thickness of the layer 28 of insulator, the size of the cavity 32 and the sizes of the spacers 36 are envisaged such that the spacers 36 are separated, at the bottom of the cavity 32, by a distance that is between 7 and 13 nm, for example 10 nm.

Figure 2D:
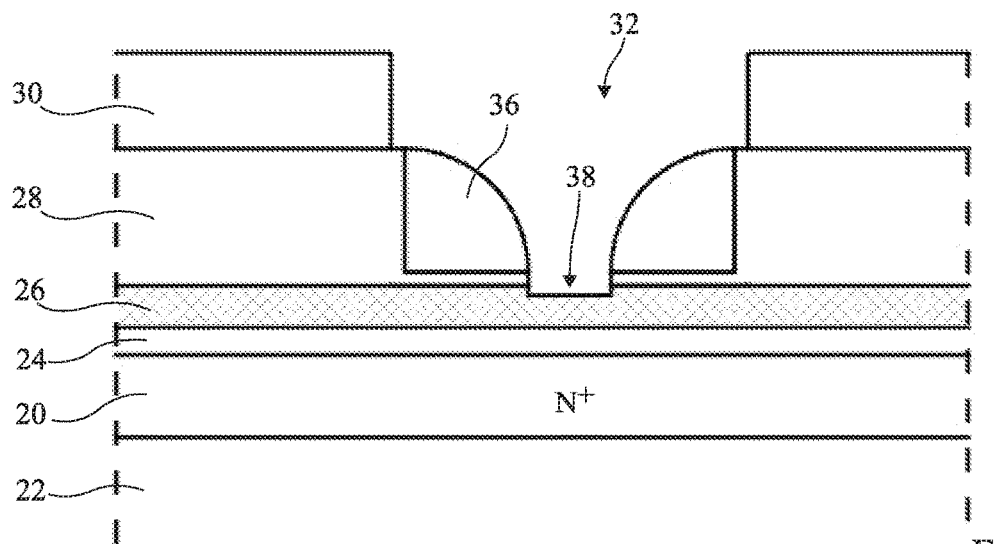

In the step the outcome of which is illustrated in FIG. 2D, the portion of the polycrystalline silicon layer 26 that was exposed in the preceding step is etched over part of its thickness in order to form a void 38 therein.

Figure 2E:
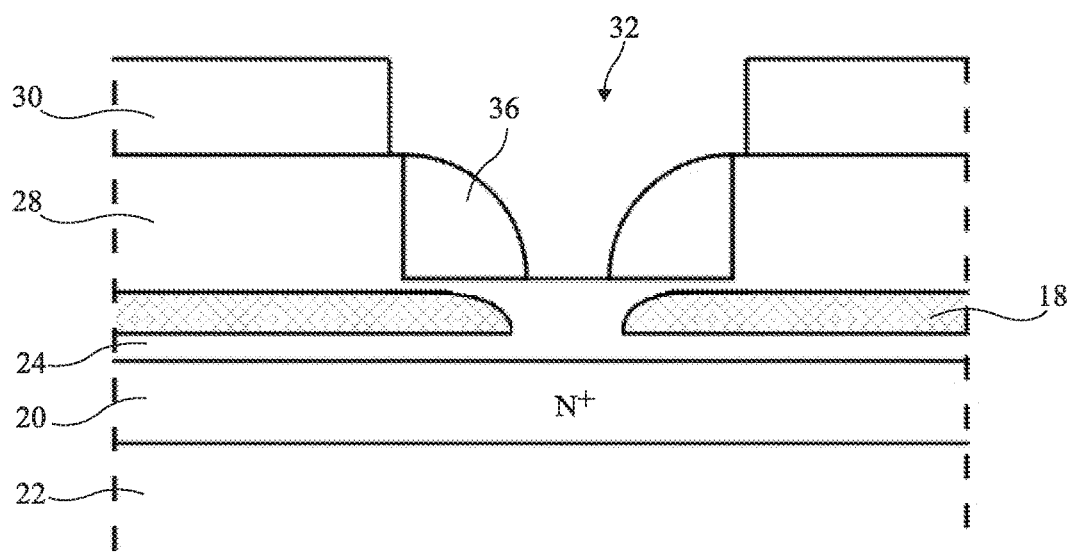

In the step the outcome of which is illustrated in FIG. 2E, a thermal oxidation operation is carried out. In the void 38, the oxidation occurs in an isotropic manner. The polycrystalline silicon below the void 38 gradually becomes silicon oxide. This silicon oxide extends until meeting the silicon oxide layer 24, so as to divide the conductive layer 26 into two portions 18 which form the gate conductors of the QVMOS transistor. At the same time, the oxidation also occurs laterally, first starting from the edges of the void 38 and subsequently, as the oxidation takes place, over the entire height of the layer 26.

After the oxidation operation, the thickness of the portions 18 has decreased, for example to a value that is between 0.5 and 2 nm, in the vicinity of the oxidation zone, as is shown schematically, and the portions 18 are set back with respect to the end of the spacers by a distance that is between 1 and 3 nm, for example 2.5 nm. Moreover, the oxidation leads to an increase in the volume of the oxidized zone. The silicon oxide therefore approximately fills the void 38 and approximately reaches the bottom of the cavity 32.

Figure 2F:
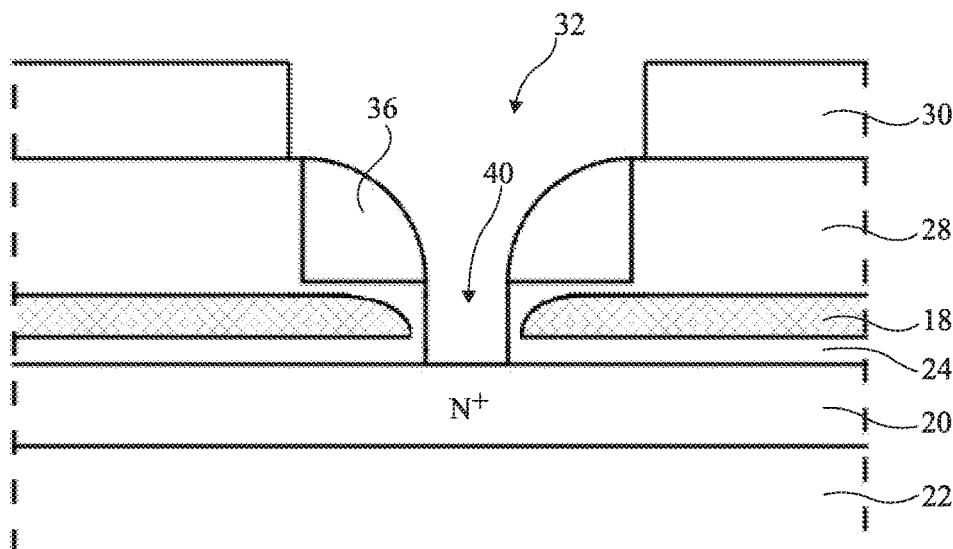

In the step the outcome of which is illustrated in FIG. 2F, a cavity 40 reaching the source zone 20 is hollowed out of the oxide using the spacers 36 as an etching mask. The oxide separating the opening 40 from the gate conductor portions 18 forms the gate insulator of the QVMOS transistor.

Figure 2G:
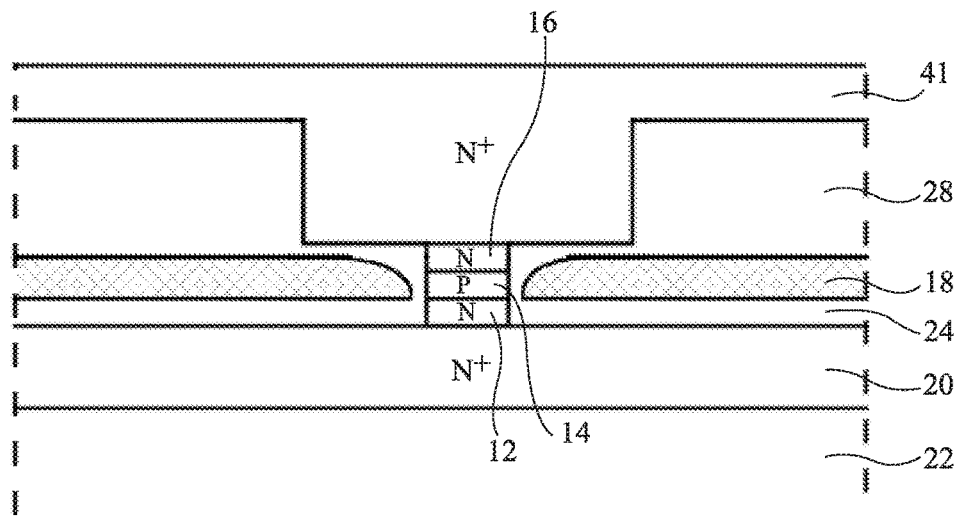

In the step the outcome of which is illustrated in FIG. 2G, an n-doped layer 12, a p-doped layer 14 and an n-doped layer 16 are formed by means of successive epitaxy operations in the opening 40 and by means of an annealing operation. The regions 12 and 16 are n-doped and form the equivalent of regions referred to as LDD regions. The regions 12 and 16 are additionally separated by the region 14 forming the actual channel of the QVMOS transistor. The region 14 is p-doped with a concentration that is for example between $10^{15}$ and $10^{16}$ atoms/cm$^3$.

The spacers 36 and the silicon nitride layer 30 are next removed. The structure is covered by a drain zone 41 composed for example of heavily n-doped silicon.

Figure 3:
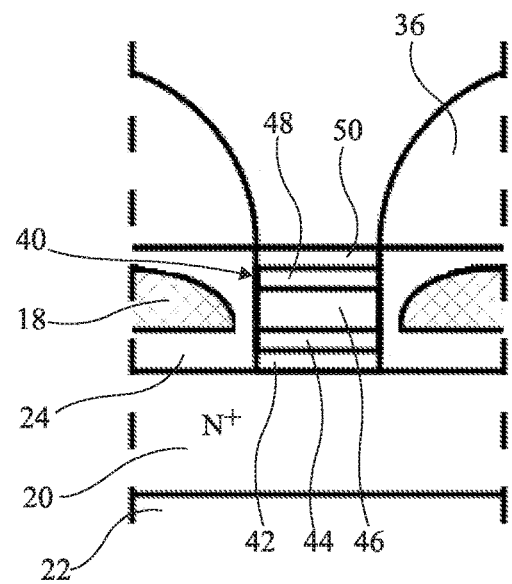
FIG. 3 shows an example of a stack of layers formed by epitaxy operations, resulting in a channel illustrated in FIGS. 1 and 2G.

FIG. 3 shows a particular manner of producing the layers 12, 14 and 16.

A first epitaxy operation is carried out so as to form an n-doped silicon layer 42, doped with arsenic. The thickness of this layer is between 4 and 8 nm, for example 6 nm. The concentration in arsenic atoms is substantially between $10^{18}$ and $10^{19}$ atoms/cm$^3$.

A second epitaxy operation is carried out so as to form a p-doped silicon layer 44, doped with boron and containing carbon. The thickness of this layer is between 1 and 3 nm, for example 2 nm. The concentration in boron atoms is substantially between $1\times10^{18}$ and $5\times10^{18}$ atoms/cm$^3$, for example $4\times10^{18}$ atoms/cm$^3$ and the concentration in carbon atoms is of the order of $10^{20}$ atoms/cm$^3$.

A third epitaxy operation is carried out so as to form a layer 46 of silicon enriched with carbon atoms. The thickness of this layer is between 10 and 15 nm, for example 13 nm. The concentration in carbon atoms is of the order of $10^{20}$ atoms/cm$^3$.

A fourth epitaxy operation is carried out so as to form a p-doped silicon layer 48, doped with boron and containing carbon. The thickness of this layer is between 2 and 4 nm, for example 3 nm. The concentration in boron atoms is substantially between $1\times10^{18}$ and $5\times10^{18}$ atoms/cm$^3$, for example $4\times10^{18}$ atoms/cm$^3$ and the concentration in carbon atoms is of the order of $10^{20}$ atoms/cm$^3$.

A fifth epitaxy operation is carried out so as to form an n-doped silicon layer 50, doped with arsenic. The thickness of this layer is between 4 and 8 nm, for example 6 nm. The concentration in arsenic atoms is substantially between $10^{18}$ and $10^{19}$ atoms/cm$^3$.

An annealing operation is subsequently carried out so as to obtain the regions 12, 14 and 16 described above.

One advantage of the embodiment presented is that it has a thermal budget that is similar to the thermal budget corresponding to the production of typical MOS and bipolar transistors. Thus, it is possible to fabricate, on one and the same wafer, these various types of transistors.

Particular embodiments have been described. Diverse variants and modifications will be apparent to those skilled in the art. In particular, all of the doping types described may be inverted.

The invention claimed is:

1. A method for fabricating a vertical transistor, comprising:
    depositing a first layer of insulator over a substrate;
    depositing a gate conductor over the first layer of insulator;
    depositing a second layer of insulator over the gate conductor;
    depositing a third layer of insulator over the second layer of insulator;
    etching a first cavity into the third and second layers of insulator until reaching the gate conductor;
    depositing a fourth layer of insulator at least within the first cavity;
    forming spacers on the fourth layer of insulator at flanks of the first cavity;
    using the spacers as a mask, etching a second cavity through the fourth layer of insulator and extending at least partially into the gate conductor;
    oxidizing a portion the gate conductor at the second cavity;
    using the spacers as a mask, etching a third cavity through the oxidized portion of the gate conductor until reaching the substrate; and
    epitaxially growing a channel of the vertical transistor in the third cavity.

2. The method according to claim 1, further comprising:
    implanting one of a source or a drain of the vertical transistor into the substrate; and
    forming the other of the drain or the source of the vertical transistor within the third cavity.

3. The method according to claim 1, wherein the first, second and fourth layers of insulator are made of silicon oxide.

4. The method according to claim 1, wherein the gate conductor is made of doped polycrystalline silicon.

5. The method according to claim 1, wherein the third layer of insulator and the spacers are made of silicon nitride.

6. The method according to claim 1, wherein epitaxially growing the channel includes forming drain and source portions and comprises:
    forming a first n-doped layer by epitaxy;
    forming a first p-doped layer by epitaxy;
    forming an undoped layer by epitaxy;
    forming a second p-doped layer by epitaxy;
    forming a second n-doped layer by epitaxy; and
    carrying out an annealing operation.

7. The method according to claim 6, wherein the first and second n-doped layers are layers of silicon doped with arsenic atoms.

8. The method according to claim 6, wherein the first and second p-doped layers are layers of silicon doped with boron atoms and containing carbon.

9. The method according to claim 6, wherein the undoped layer is a layer of silicon enriched with carbon atoms.

10. A method for fabricating a vertical transistor, comprising:
    depositing a first layer of insulator over a semiconductor substrate;
    depositing a gate conductor over the first layer of insulator;
    depositing a second layer of insulator over the gate conductor;
    forming a mask over the second layer of insulator, said mask having a mask opening;
    etching through the mask opening to form a first cavity extending through the second layer of insulator and at least partially exposing the gate conductor;
    oxidizing a portion the gate conductor at the first cavity to form an oxide region;
    etching a second cavity through the oxide region of the gate conductor until reaching the semiconductor substrate, said etching leaving an oxide portion of the oxide region surrounding the second cavity; and
    epitaxially growing a channel of the vertical transistor in the second cavity, said channel separated from the gate conductor by the oxide portion.

11. The method according to claim 10, further comprising forming a drain or a source on opposite sides of the channel within the second cavity.

12. The method according to claim 10, wherein the first and second layers of insulator are made of silicon oxide.

13. The method according to claim 10, wherein the gate conductor is made of doped polycrystalline silicon.

14. The method according to claim 10, wherein the mask is of silicon nitride.

15. The method according to claim 10, wherein epitaxially growing the channel includes forming drain and source regions and comprises:
   forming a first n-doped layer by epitaxy;
   forming a first p-doped layer by epitaxy;
   forming an undoped layer by epitaxy;
   forming a second p-doped layer by epitaxy;
   forming a second n-doped layer by epitaxy; and
   carrying out an annealing operation.

16. The method according to claim 15, wherein the first and second n-doped layers are layers of silicon doped with arsenic atoms.

17. The method according to claim 15, wherein the first and second p-doped layers are layers of silicon doped with boron atoms and containing carbon.

18. The method according to claim 15, wherein the undoped layer is a layer of silicon enriched with carbon atoms.

19. The method according to claim 10, wherein epitaxially growing the channel includes forming drain and source regions and comprises:
   forming by epitaxy in the second cavity a drain or source region doped with a first conductivity;
   forming by epitaxy in the second cavity over the drain or source region the channel doped with a second conductivity; and
   forming by epitaxy in the second cavity over the channel a source or drain region doped with the first conductivity.

20. The method according to claim 10, wherein etching through the mask opening to form the first cavity comprises extending the etching to at least partially penetrate into the gate conductor.

* * * * *